(12) United States Patent
Jachim et al.

(10) Patent No.: US 6,507,624 B1
(45) Date of Patent: Jan. 14, 2003

(54) BANDPASS SAMPLING ARCHITECTURE FOR WIDE-FREQUENCY BAND SIGNAL ANALYSIS

(75) Inventors: Stephen P. Jachim, Portland, OR (US); Mihir K. Ravel, Portland, OR (US); Steven H. Pepper, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/296,438

(22) Filed: Apr. 21, 1999

(51) Int. Cl.[7] .......................... H03K 9/00; H04L 27/06; H04L 27/14; H04L 27/22
(52) U.S. Cl. .................... 375/316; 375/224; 324/76.23; 324/76.24
(58) Field of Search ................. 375/316, 224, 375/228; 324/76.23, 76.24, 76.29, 76.21, 76.19, 76.41, 76.42, 76.44, 76.45, 76.47; 455/226.4, 226.1; 702/75–77

(56) References Cited

U.S. PATENT DOCUMENTS

| | | | |
|---|---|---|---|
| 4,257,104 A | 3/1981 | Martin et al. | 364/485 |
| 4,495,586 A | 1/1985 | Andrews | 364/487 |
| 4,607,215 A | 8/1986 | Takano et al. | 324/77 B |
| 4,685,065 A | 8/1987 | Braun et al. | 364/485 |
| 4,839,582 A | 6/1989 | Fukaya et al. | 324/77 B |
| 4,890,099 A | 12/1989 | Takano | 340/724 |
| 5,038,096 A | 8/1991 | Obie et al. | 324/77 B |
| 5,162,723 A * | 11/1992 | Marzalek et al. | 324/76.19 |
| 5,225,776 A | 7/1993 | Dobos et al. | 324/121 R |
| 5,629,703 A | 5/1997 | Lewallen | 341/155 |
| 5,706,202 A * | 1/1998 | Itahara et al. | 702/77 |
| 6,356,067 B1 * | 3/2002 | Nara | 324/76.23 |
| 6,418,162 B1 * | 7/2002 | Yau et al. | 375/224 |

OTHER PUBLICATIONS

"A 12b 50MSample/s Cascaded Folding and Interpolating ADC", P. Vorenkamp and R. Roovers, 1997 International Solid–State Circuits Conference, Digest, pp. 133–135.

* cited by examiner

*Primary Examiner*—Phuong Phu
(74) *Attorney, Agent, or Firm*—William K. Bucher; Francis I. Gray

(57) ABSTRACT

A bandpass sampling system (10) of this invention employs a conventional mixer (14) driven by a frequency-tunable LO (16) to upconvert a signal frequency band to an IF frequency band that is above the signal frequency band. The IF frequency band is passed through an IF bandpass filter (18) to provide to subsequent digitization stages (20, 24) an IF bandpass range of signal frequency components. In this architecture, the IF bandpass filter acts as an anti-alias filter for the digitization stages. The LO frequency is selected to place the upconverted signal frequency band within the pass band of the IF bandpass filter. The resultant IF bandpass signal is sampled and digitized at a rate that is commensurate with the IF bandwidth, but typically much lower than the IF bandpass center frequency. Signal sampling is carried out by a sample-and-hold or a track-and-hold circuit (20), the output of which is applied to an ADC (24) that is clocked (22) at the same rate as the sampling circuit.

22 Claims, 2 Drawing Sheets

BANDPASS SAMPLING ARCHITECTURE FOR WIDE-FREQUENCY BAND SIGNAL ANALYSIS

TECHNICAL FIELD

This invention relates to the field of electronic test and measurement and more particularly to a bandpass sampling technique for analyzing wideband electrical signal spectra.

BACKGROUND OF THE INVENTION

Prior signal processing and analysis systems, such as spectrum analyzers, typically employ multiple frequency conversion stages to convert a signal band of interest to a baseband signal that is low-pass filtered before being digitized by an analog-to-digital converter ("ADC") for further processing and display. This architectural approach places the signal frequency being measured within the first Nyquist band of the ADC to prevent aliasing of out-of-band signals into the analysis band of frequencies.

For example, U.S. Pat. No. 4,257,104 for APPARATUS FOR SPECTRUM ANALYSIS OF AN ELECTRICAL SIGNAL describes a fully featured spectrum analyzer system that employs multiple down converters, intermediate frequency ("IF") amplifiers, a detector, and video processor prior to the ADC. Simpler architectural approaches are described in U.S. Pat. Nos. 4,607,215 for SPECTRUM ANALYZER, 4,890,099 for SIGNAL ANALYZER HAVING PARTIALLY SCROLLING FUNCTION FOR DISPLAY SCREEN, 4,839,582 for SIGNAL ANALYZER APPARATUS WITH AUTOMATIC FREQUENCY MEASURING FUNCTION, and 5,038,096 for SPECTRUM ANALYZER CIRCUIT FOR PULSED INPUT SIGNALS. However, all of these architectural approaches describe signal down conversion, IF amplification, filtering, and detection of a baseband of frequencies prior to digitization for subsequent signal processing and analysis.

In another example, U.S. Pat. No. 5,629,703 for METHOD FOR REDUCING HARMONIC DISTORTION IN AN ANALOG-TO-DIGITAL CONVERTER SYSTEM, which is assigned to the assignee of this application, describes a spectrum analysis architecture employing down conversion to a baseband of frequencies and low-pass filtering, but does not employ detection prior to digitization. The low-pass filtering limits the signal analysis bandwidth to a relatively narrow 9 MHz.

The above-described signal measurement systems are not only complex and costly, but also require a wide local oscillator ("LO") tuning or sweeping range to achieve a usefully wide signal analysis bandwidth. Such signal measurement systems further require an ADC having a relatively high sampling rate to achieve alias-free signal digitizing within the first Nyquist band.

What is needed, therefore, is an electrical signal analysis architecture having reduced complexity and cost while achieving a wide signal analysis bandwidth with a relatively narrow LO tuning range and a relatively low ADC sampling rate.

SUMMARY OF THE INVENTION

An object of this invention is, therefore, to provide an apparatus and a method for analyzing electrical signals.

Another object of this invention is to provide a simpler and less costly spectrum analyzer architecture than is found in prior architectures.

A further object of this invention is to provide a spectrum analyzer having a wide signal analysis bandwidth while requiring a relatively narrow LO tuning range and a relatively low ADC sampling rate.

A bandpass sampling signal processing and analysis architecture of this invention employs a conventional mixer driven by a frequency-tunable LO to upconvert a signal frequency band to an IF frequency band that is above the signal frequency band. The IF frequency band is passed through an IF bandpass filter to provide to subsequent digitization stages an IF bandpass range of signal frequency components. In this architecture, the IF bandpass filter acts as an anti-alias filter for the digitization stages. The LO frequency is selected to place the upconverted signal frequency band within the pass band of the IF bandpass filter. The resultant IF bandpass signal is sampled and digitized at a rate that is commensurate with the IF bandwidth, but typically much lower than the IF bandpass center frequency. Signal sampling is carried out by a sample-and-hold or a track-and-hold circuit, the output of which is applied to an ADC that is clocked at the same rate as the sampling circuit.

The bandpass sampling architecture of this invention is advantageous because it is inherently less complex and costly than prior down conversion and base band sampling architectures.

The bandpass sampling architecture of this invention is also advantageous because upconversion of the signal frequency band provides a wide signal analysis bandwidth while requiring only a relatively narrow (percentage-wise) LO tuning range (typically less than an octave).

The bandpass sampling architecture of this invention is further advantageous because sampling of the IF bandpass signal prior to digitizing allows using an ADC having a much lower sampling rate than is ordinarily required for alias-free sampling within the first Nyquist band.

Additional objects and advantages of this invention will be apparent from the following detailed description of a preferred embodiment thereof that proceeds with reference to the accompanying drawings.

DETAILED DESCRIPTION OF A PREFERRED EMBODIMENT

Figure 1:
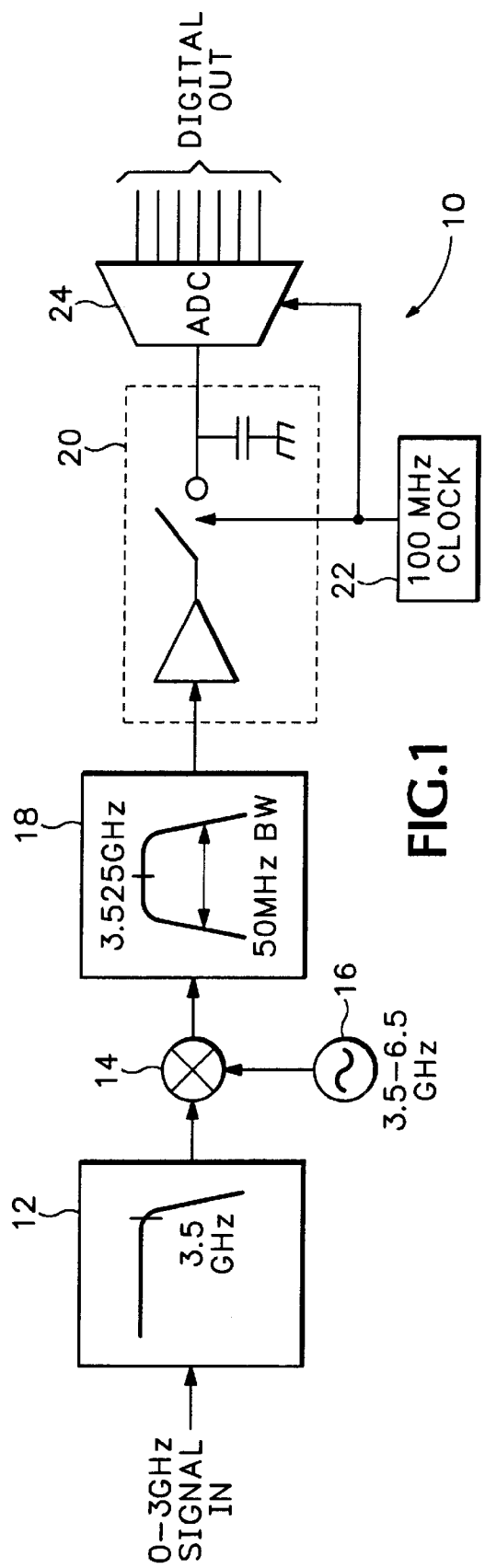
FIG. 1 is an electrical block diagram showing a component interconnection architecture of this invention used to implement a bandpass sampling signal processing and analyzing system.

FIG. 1 shows a bandpass sampling system 10 of this invention in which a 3.5 GHz low-pass filter 12 receives an input signal having frequency components ranging from about 0 Hz to about 3 GHz and passes the filtered input signal to a mixer 14. An LO 16 provides to mixer 14 an LO signal that is tunable or sweepable from about 3.5 GHz to about 6.5 GHz to upconvert the input signal frequency components to an IF frequency band that is centered at about 3.525 GHz. A 3.525 GHz IF bandpass filter 18 having about a 50 MHz bandwidth provides to a fast sampling circuit 20 a 50 MHz IF bandpass range of the input signal frequency components. A clock 22 oscillating at about 100 MHz provides sampling pulses to fast sampling circuit 20, which performs track-and-hold sampling of the 50 MHz IF bandpass range of the input signal frequency components at a 100 megasample per second ("Msps") rate. An ADC 24 also receives the 100 MHz sampling pulses from clock 22 to digitize each signal sample provided by fast sampling circuit 20. The digital output from ADC 24 is conventionally processed, analyzed, and displayed as needed to suit a variety of applications.

Unless the center frequency of IF bandpass filter 18 is properly chosen, there can be overlap aliasing of the negative and positive frequency components of the input signal frequency components if any harmonics of the sampling frequency fall within the pass band of IF bandpass filter 18. This could occur if, for example, the pass band was centered at 3.50 GHz. One solution is to offset the center of the IF pass band by one-quarter of the sampling frequency, which for the above-described preferred embodiment is 3.525 GHz. Another solution is to provide quadrature channels at either mixer 14 or after IF bandpass filter 18.

In bandpass sampling system 10, the 50 MHz bandwidth of IF bandpass filter 18 acts as an anti-alias filter for the 100 Msps fast sampling circuit 20 and ADC 24. The IF bandpass range of the input signal frequency component is sampled and digitized at a rate that is at least double the 50 MHz IF bandwidth, but is much lower than the 3.525 GHz IF bandpass center frequency. This approach places the signals of interest within the first Nyquist band of ADC 24 and prevents aliasing of out-of-band signals into the analysis band.

Proper operation of bandpass sampling system 10 depends on fast sampling circuit 20 having a suitably wide bandwidth track-and-hold or sample-and-hold circuit with a correspondingly narrow sample acquisition time. A suitable sampling circuit can be based on circuits described in U.S. Pat. No. 5,225,776 for METHOD AND APPARATUS FOR PROBING AND SAMPLING AN ELECTRICAL SIGNAL, which is assigned to the assignee of this application. Of course, many other sampling circuit embodiments would also be suitable depending on the particular application.

Figure 2:
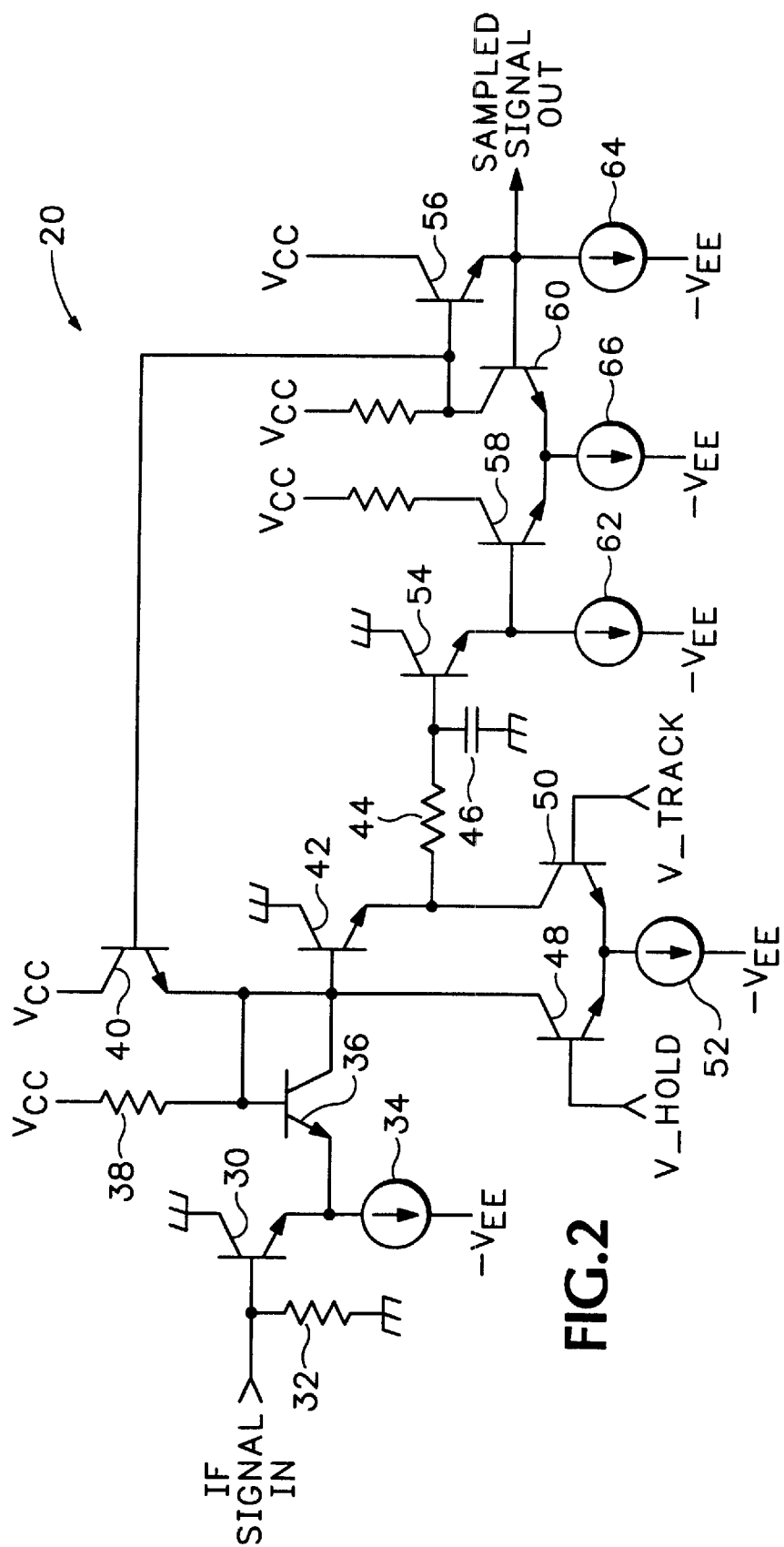
FIG. 2 is a simplified schematic circuit diagram showing a preferred signal sampling circuit used in the system of FIG. 1.

FIG. 2 shows a preferred track-and-hold embodiment of fast sampling circuit 20 in which an emitter follower buffer transistor 30 receives the 50 MHz IF bandpass range of the input signal frequency components across a 50 ohm termination 32. The buffered IF bandpass signal appears at the emitter of buffer transistor 30, which is pulled down by current source 34 and coupled through a diode-connected transistor 36 that receives biasing current from a resistor 38 that is connected to a voltage source VCC. The node formed by resistor 38 and the base and collector of transitor 36 is connected to the emitter of a transistor 40, the collector of which is connected to a bias voltage, such as VCC, and the base of which is coupled to the sampled signal output of sampling circuit 20. In track mode, transistor 40 is cut off by the voltage developed at the junction of resistor 38 and diode-connected transistor 36. The buffered IF bandpass signal couples through diode-connected transistor 36 to the base of an emitter follower transistor 42. The resultant IF bandpass signal is coupled through a resistor 44 and stored on a capacitor 46. Resistor 44 and capacitor 46 form a low-pass filter that reduces the noise bandwidth of fast sampling circuit 20 and improves its linearity.

To switch from track mode to hold mode, fast sampling circuit 20 employs a differential pair of transistors 48 and 50, the emitters of which are electrically connected together and to a current source 52. The collector of transistor 48 is electrically connected to the junction formed by transistors 36 and 40, resistor 38, and the base of emitter follower transistor 42. The collector of transistor 50 is electrically connected to the junction formed by resistor 44 and the emitter of emitter follower transistor 42.

In track mode, a V_track signal applied to the base of transistor 50 is at a higher potential than a V_hold signal applied to the base of transistor 48, turning transistor 50 on and transistor 48 off, thereby causing current to flow from ground, through transistors 42 and 50, and into current source 52. The IF bandpass signal passes through emitter follower buffer transistor 30, diode-connected transistor 36, emitter follower transistor 42, resistor 44, and is tracked and stored on capacitor 46. A non-inverting buffer amplifier comprising emitter follower transistors 54 and 56 and differential-connected transistors 58 and 60 receives the sampled signal voltage held on capacitor 46 and produces a buffered version thereof at the emitter of transistor 56. Transistors 54, 45, 58, and 60 are biased by associated current sources 62, 64, and 66.

The voltage at the base of transistors 56 and 40 is at the same potential as the sampled signal voltage held on capacitor 46. Therefore, the clamp voltage established at the emitter of transistor 40 tracks the input signal voltage. This is important for improving the gain-dependent linearity and dynamic range of sampling circuit 20.

In hold mode, the V_track signal applied to the base of transistor 50 is at a lower potential than the V_hold signal applied to the base of transistor 48, turning transistor 48 on and transistor 50 off, thereby causing current to cease flowing through transistors 42 and 50 and turning emitter follower transistor 42 off. Because transistor 48 is on, current flows from VCC, through transistors 40 and 48 to current source 52. As described above, the emitter of transistor 40 is clamped at 0.7 volts below the voltage stored on capacitor 46, thereby reverse biasing diode-connected transistor 36 and emitter follower transistor 42. The instantaneous IF bandpass signal voltage stored on capacitor 46 is available during hold mode at the emitter of transistor 56 for digitization by ADC 24.

Fast sampling circuit 20 is preferably implemented using a high-frequency analog integrated circuit fabrication process, such as the silicon/germanuim process that is commercially available from IBM, Corporation of Essex Junction, Vermont.

The bandpass sampling architecture of this invention is advantageous because:

it is inherently less complex and costly than prior down conversion to base band sampling architectures;

upconversion of the signal frequency band provides a wide signal analysis bandwidth while requiring only a relatively narrow (percentage-wise) LO tuning range that is typically less than one octave; and sampling of the IF bandpass signal prior to digitizing allows using an ADC having a much lower sampling rate than is ordinarily required for alias-free sampling within the first Nyquist band.

This invention is particularly useful for signal processing, analysis, and display of communication signal frequencies ranging from about 1 MHz to about 2,500 MHz Skilled workers will recognize that portions of this invention may be implemented differently from the implementations described above for a preferred embodiment. For example, the various frequencies, bandwidths, and sampling rate may be different from those described above, and various amplifiers, filters, LOs, and mixers could be added to system 10 to suit particular applications. Likewise, downconversion to a nonbaseband range of frequencies is considered within the scope of this invention.

It will be obvious to those having skill in the art that many changes may be made to the details of the above-described embodiment of this invention without departing from the underlying principles thereof Accordingly, it will be appreciated that this invention is also applicable to signal processing and analysis applications other than those found in spectrum analyzers. The scope of the present invention should, therefore, be determined only by the following claims.

What is claimed is:

1. A method of sampling an electrical input signal spectrum having a wide frequency band comprising:

receiving an input signal having a base range of frequency components within the wide frequency band;

converting the base range of frequency components to an intermediate range of frequency components above the base range of frequency components;

bandpass filtering the intermediate range of frequency components to generate a relatively narrow bandpass range of frequency components; and sampling and digitizing the relatively narrow bandpass range of frequency components.

2. The method of claim 1 in which the converting step includes providing a local oscillator signal having a frequency tunable over a mixing range of frequencies, and mixing the input signal and the local oscillator signal.

3. The method of claim 2 in which the mixing range of frequencies spans less than about one octave.

4. The method of claim 2 in which the mixing range of frequencies spans from about 3.5 GHz to about 6.5 GHz.

5. The method of claim 1 in which the converting step is an upconverting step.

6. The method of claim 1 in which the base range of frequency components span from about 0 GHz to about 3.5 GHz and the intermediate range of frequency components are all higher in frequency than about 3.5 GHz.

7. The method of claim 1 in which the relatively narrow bandpass range of frequency components is within a first Nyquist band of an analog-to-digital converter digitizing the sampled relatively narrow bandpass range of frequency components.

8. The method of claim 1 further including low-pass filtering the input signal prior to the converting step.

9. The method of claim 1 in which at least one of the sampling and digitizing is carried out at a frequency that is greater than about twice the bandwidth of the relatively narrow bandwidth range of frequency components.

10. The method of claim 1 in which at least one of the sampling and digitizing is carried out at a rate of about 100 million operations per second.

11. An apparatus for sampling an electrical input signal spectrum having a wide frequency band comprising:

a mixer receiving an input signal having a base range of frequency components within the wide frequency band and converting the base range of frequency components to an intermediate range of frequency components above the base range of frequency components;

a bandpass filter filtering the intermediate range of frequency components to generate a relatively narrow bandpass range of frequency components;

a sampling circuit performing one of a sample-and-hold and a track-and-hold operation on the relatively narrow bandpass range of frequency components to provide data samples; and an analog-to-digital converter digitizing the data samples.

12. The apparatus of claim 11 further including a local oscillator that generates a local oscillator signal having a frequency tunable over a mixing range of frequencies, the input signal and the local oscillator signal being mixed together by the mixer.

13. The apparatus of claim 12 in which the mixing range of frequencies vary by less than about one octave.

14. The apparatus of claim 12 in which the mixing range of frequencies span from about 3.5 GHz to about 6.5 GHz.

15. The apparatus of claim 11 in which the intermediate range of frequency components is higher in frequency than the base range of frequency components.

16. The apparatus of claim 11 in which the base range of frequency components span from about 0 GHz to about 3.5 GHz and the intermediate range of frequency components are all higher in frequency than about 3.5 GHz.

17. The apparatus of claim 11 in which the relatively narrow bandpass range of frequency components is within a first Nyquist band of the analog-to-digital converter digitizing the data samples.

18. The apparatus of claim 11 further including a low-pass filter that limits the range of input signal frequency components to less than the intermediate range of frequency components.

19. The apparatus of claim 11 in which at least one of the sampling circuit and the analog-to-digital converter operate at a rate that is greater than about twice the bandwidth of the relatively narrow bandwidth range of frequency components.

20. The apparatus of claim 11 in which at least one of the sampling circuit and the analog-to-digital converter operate at a rate of about 100 million operations per second.

21. The method as recited in claim 1 wherein the sampling and digitizing step comprises the steps of:

sampling the relatively narrow bandwidth range of frequency components to produce data samples; and digitizing the data samples.

22. The method as recited in claims 1 or 21 wherein the sampling and digitizing step is carried out at a frequency that is greater than about twice the bandwidth of the relatively narrow bandwidth range of frequency components.

* * * * *